United States Patent
Owa et al.

(10) Patent No.: US 8,570,632 B2
(45) Date of Patent: Oct. 29, 2013

(54) MICROACTUATOR, OPTICAL DEVICE AND EXPOSURE APPARATUS, AND DEVICE MANUFACTURING METHOD

(75) Inventors: Soichi Owa, Kumagaya (JP); Junji Suzuki, Tama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/085,001

(22) Filed: Apr. 12, 2011

(65) Prior Publication Data

US 2011/0187810 A1    Aug. 4, 2011

Related U.S. Application Data

(60) Division of application No. 12/348,530, filed on Jan. 5, 2009, now Pat. No. 7,952,780, which is a continuation of application No. PCT/JP2007/063578, filed on Jul. 6, 2007.

(30) Foreign Application Priority Data

Jul. 6, 2006   (JP) ................................. 2006-186449

(51) Int. Cl.
   *G02B 7/182*   (2006.01)
   *G02B 26/08*   (2006.01)

(52) U.S. Cl.
   USPC ................. 359/212.1; 359/221.2; 359/224.1; 359/295; 359/846; 359/900; 355/67; 355/77

(58) Field of Classification Search
   USPC .......... 359/212.1, 224.1, 295, 846, 849, 900, 359/221.2; 355/67, 77; 378/34, 35
   See application file for complete search history.

(56) References Cited

U.S. PATENT DOCUMENTS

| | | | |
|---|---|---|---|
| 4,280,756 | A | 7/1981 | Albertinetti |
| 4,441,791 | A | 4/1984 | Hornbeck |
| 4,944,580 | A | 7/1990 | MacDonald |
| 5,210,653 | A | 5/1993 | Schell |
| 5,526,172 | A | 6/1996 | Kanack |
| 5,535,047 | A | 7/1996 | Hornbeck |
| 5,579,151 | A | 11/1996 | Cho |
| 6,040,909 | A | 3/2000 | Hasegawa et al. |
| 6,384,952 | B1 | 5/2002 | Clark et al. |

(Continued)

FOREIGN PATENT DOCUMENTS

| | | |
|---|---|---|
| JP | 8-334709 | 12/1996 |
| JP | 2004-117832 | 4/2004 |

(Continued)

OTHER PUBLICATIONS

U.S. Appl. No. 12/348,530, filed Jan. 5, 2009, Soichi Owa et al.
International Search Report mailed Oct. 2, 2007, for International Application No. PCT/JP2007/063578.

(Continued)

*Primary Examiner* — Ricky D Shafer
(74) *Attorney, Agent, or Firm* — Staas & Halsey LLP

(57) ABSTRACT

A pair of support members each having a spring section in a part thereof support a mirror element, and a pair of drive mechanisms arranged respectively corresponding to a pair of the support members transform the spring sections of the corresponding support members, thereby changing a distance between each of support points at which the support members support the mirror element and a base. Accordingly, the mirror element can be translated by driving all of the drive mechanisms, or the mirror element can be inclined with respect to the base by driving some of the drive mechanisms.

15 Claims, 8 Drawing Sheets

(56) References Cited

U.S. PATENT DOCUMENTS

| | | | |
|---|---|---|---|
| 6,842,277 B2 | 1/2005 | Watson | |
| 6,914,712 B2 | 7/2005 | Kurosawa | |
| 7,125,128 B2 * | 10/2006 | Novak | 359/849 |
| 7,125,158 B2 | 10/2006 | Novak | |
| 7,239,372 B2 | 7/2007 | Honda | |
| 7,518,780 B2 | 4/2009 | Papavasiliou et al. | |
| 7,952,780 B2 * | 5/2011 | Owa et al. | 359/200.6 |
| 2004/0207939 A1 | 10/2004 | Kurosawa | |
| 2005/0057120 A1 | 3/2005 | Nanataki et al. | |
| 2005/0082946 A1 | 4/2005 | Takeuchi et al. | |
| 2005/0111815 A1 | 5/2005 | Kimura | |
| 2005/0236928 A1 | 10/2005 | Kurozuka et al. | |

FOREIGN PATENT DOCUMENTS

| | | |
|---|---|---|
| JP | 2004-119933 | 4/2004 |
| JP | 2005-57250 | 3/2005 |
| JP | 2005-91576 | 4/2005 |
| JP | 2005-91578 | 4/2005 |
| JP | 2005-341788 | 12/2005 |

OTHER PUBLICATIONS

Japanese Patent Office Notification of Reasons for Refusal mailed Nov. 6, 2012 for corresponding Japanese Patent Application No. 2008-523755.
Korean Office Action mailed Jan. 22, 2013 in corresponding Korean Patent Application No. 10-2008-7020651.
Internationai Search Report mailed Oct. 2, 2007 for International Application No. PCT/JP2007/063578.
Written Opinion of the International Searching Authority for the corresponding PCT Application No. PCT/JP2007/063578 mailed Oct. 2, 2007.
Notice of Allowance and Fee(s) Due mailed Mar. 25, 2011, in U.S. Appl. No. 12/348,530.
Notice of Allowance and Fee(s) Due mailed Dec. 29, 2010, in U.S. Appl. No. 12/348,530.
Advisory Action mailed Nov. 9, 2010, in U.S. Appl. No. 12/348,530.
Office Action mailed Aug. 19, 2010, in U.S. Appl. No. 12/348,530.
Office Action mailed Mar. 19, 2010, in U.S. Appl. No. 12/348,530.
Office Action mailed Nov. 12, 2009, in U.S. Appl. No. 12/348,530.
Office Action mailed Aug. 19, 2009, in U.S. Appl. No. 12/348,530.

* cited by examiner

MICROACTUATOR, OPTICAL DEVICE AND EXPOSURE APPARATUS, AND DEVICE MANUFACTURING METHOD

CROSS-REFERENCE TO RELATED APPLICATIONS

This application is a divisional of application Ser. No. 12/348,530, filed Jan. 5, 2009, now U.S. Pat. No. 7,952,780, which is a continuation of International Application PCT/JP2007/063578, with an international filing date of Jul. 6, 2007, and which was not published in English, the disclosures of which are hereby incorporated herein by reference in their entireties.

BACKGROUND OF THE INVENTION

1. Field of the Invention

The present invention relates to microactuators, optical devices and exposure apparatuses, and device manufacturing methods, and more particularly, to a microactuator that drives a driven body, an optical device equipped with the microactuator and an exposure apparatus equipped with the optical device, and a device manufacturing method using the exposure apparatus.

2. Description of the Background Art

Conventionally, in a lithography process for manufacturing electron devices such as semiconductor devices or liquid crystal display devices, a projection exposure apparatus is used that transfers a pattern formed on a mask (such as a reticle, or a photomask) onto a substrate (such as a glass plate, or a wafer), on which a sensitive agent such as a resist is coated, via a projection optical system.

In recent years, various scanning exposure apparatuses of a so-called maskless type have been proposed, which use a variable shaped mask (which is also called an active mask) instead of a costly mask (a mask which is a fixed pattern master), regardless of size of a device pattern. As a kind of this maskless type scanning exposure apparatus, a scanning exposure apparatus that uses a DMD (Digital Micromirror Device) which is a type of a reflective spatial light modulator serving as a variable shaped mask has been proposed (e.g., refer to Kokai (Japanese Unexamined Patent Application Publication) No. 2004-327660). According to the scanning exposure apparatus that uses the DMD as a variable shaped mask, by changing a pattern generated at a variable shaped mask in synchronization with scanning of a substrate stage and by exposing a substrate held on the substrate stage, a desired pattern can be formed on the substrate without difficulty, and also cost reduction and downsizing of the apparatus are possible.

However, when driving a conventional DMD, a time required for drive and a vibration attenuation time (settling time) which was several times longer than the time required for drive were needed. Therefore, there is a possibility that a drive speed required when performing exposure cannot be achieved, and as a consequence, exposure using the DMD cannot be performed.

Further, in the conventional DMD, for example, as shown in FIG. 9, the state of a micromirror was switched between a state indicated by a reference sign M (a state of being inclined with respect to a base BS) and a state indicated by a reference sign M' (a state of being inclined with respect to base BS in an opposite direction to the state indicated by reference sign M), and when the micromirror was in the state indicated by reference sign M, the micromirror was regarded as being in a so-called ON state. When an illumination light IL is irradiated on the micromirror in this On state, illumination light IL is reflected off a reflection surface of the micromirror and is incident on a projection optical system PL (i.e. exposure is performed using illumination light IL via the micromirror in the ON state). In the meantime, when the micromirror is in the state indicated by reference sign M', the micromirror is in a so-called OFF state, and illumination light IL incident on the micromirror in this OFF state is reflected off the micromirror, and then is not incident on projection optical system PL.

However, as shown in FIG. 9, the micromirrors in the ON state are disposed along base BS in a state of being inclined with respect to base BS, and therefore the reflection surfaces of the adjacent micromirrors M are deviated from each other by a distance D in a normal line direction of the reflection surfaces of micromirrors M. Accordingly, illumination lights IL via the respective micromirrors M have the phase difference from one another, and such phase difference could affect the exposure accuracy.

Furthermore, an active mask that uses a DMD having a function similar to a phase shift mask is expected to appear in the future.

SUMMARY OF THE INVENTION

The present invention has been made under the circumstances described above, and according to a first aspect of the present invention, there is provided a first microactuator that drives a driven body, the microactuator comprising: a plurality of support members that support the driven body and each have an elastic section in a part thereof; and a plurality of drive mechanisms that are arranged respectively corresponding to a plurality of the support members, wherein each of a plurality of the drive mechanisms changes a distance between a support point at which its corresponding support member supports the driven body and a predetermined reference plane, by transforming the elastic section of the corresponding support member.

With this microactuator, by driving an arbitrary drive mechanism, a distance between a support point at which the corresponding support member supports the driven body and a predetermined reference plane changes. Accordingly, the driven body can be translated by driving all of the drive mechanisms, or the driven body can be inclined with respect to the reference plane by driving some of the drive mechanisms.

According to a second aspect of the present invention, there is provided a second microactuator that drives a driven body, the microactuator comprising: a support member having a pair of elastic sections, a coupling section that couples the elastic sections, and a connecting section that connects the coupling section and the driven body; and a pair of drive mechanisms that are arranged respectively corresponding to a pair of the elastic sections, wherein each of a pair of the drive mechanisms changes an attitude of the driven body by transforming its corresponding elastic section.

With this microactuator, by uniforming the drive amounts of a pair of the drive mechanisms that respectively transform the corresponding elastic sections of the support member, the driven body can be driven in parallel. Further, by making the drive amounts of a pair of the drive mechanisms different, the connection section is inclined, and therefore, the driven body can be inclined by an amount in accordance with the inclined angle.

According to a third aspect of the present invention, there is provided a third microactuator that drives a driven body, the microactuator comprising: a support member which supports the driven body, and a part of which has an elastic force in a direction orthogonal to a predetermined plane and in a torsion direction with respect to the predetermined plane; and a pair of drive mechanisms that are arranged on both sides with the support member in between, and can each make a force in a direction orthogonal to the predetermined plane act on the driven body.

With this microactuator, the support member has an elastic force in a direction orthogonal to a predetermined plane and a torsion direction with respect to the predetermined plane, and therefore, by a pair of drive mechanisms making the same forces act on the driven body, the driven body can be translated in a direction orthogonal to the predetermined plane, and by a pair of drive mechanisms making the different forces act on the driven body, the driven body can be inclined with respect to the reference plane.

According to a fourth aspect of the present invention, there is provided an optical device, comprising: an optical element; and any one of the first to third microactuators of the present invention that drives the optical element serving as the driven body.

With this optical device, because an optical element can be translated or inclined, the attitude of the optical element can be changed relatively freely, and therefore, the optical device can be used for various purposes.

According to a fifth aspect of the present invention, there is provided a first exposure apparatus that exposes an object using an illumination light, the apparatus comprising: the optical device of the present invention that is placed on an optical path of the illumination light and comprises a controller that drives and controls the drive mechanism(s), wherein the object is exposed using the illumination light via the optical device.

With this apparatus, since the optical device of the present invention is placed on an optical path of an illumination light and an object is exposed using the illumination light via the optical device, a state of the illumination light that reaches the object can be controlled by changing the attitude of the optical element equipped in the optical device.

According to a sixth aspect of the present invention, there is provided a second exposure apparatus that exposes an object, the apparatus comprising: the optical device of the present invention that generates a predetermined pattern by being irradiated with an illumination light and has an optical element that is a mirror element, in which the optical element is switched between a first ON state, a second ON state and an OFF state, wherein a phase of the illumination light via an optical element in the first ON state and a phase of the illumination light via an optical element in the second ON state shift from each other by a half wavelength.

With this apparatus, by switching a state of each of a plurality of optical elements between the first ON state, the second ON state and the OFF state, the optical device functions as a phase shift mask, and therefore it becomes possible to generate high-precision patterns.

Further, since the first and second exposure apparatuses of the present invention are used in a lithography process, it becomes possible to improve the productivity of microdevices with high integration. Accordingly, from another aspect, it can also be said that the present invention is a device manufacturing method using any one of the first and second exposure apparatuses of the present invention.

BRIEF DESCRIPTION OF THE DRAWINGS

In the accompanying drawings.

DESCRIPTION OF THE EMBODIMENTS

Figure 1:
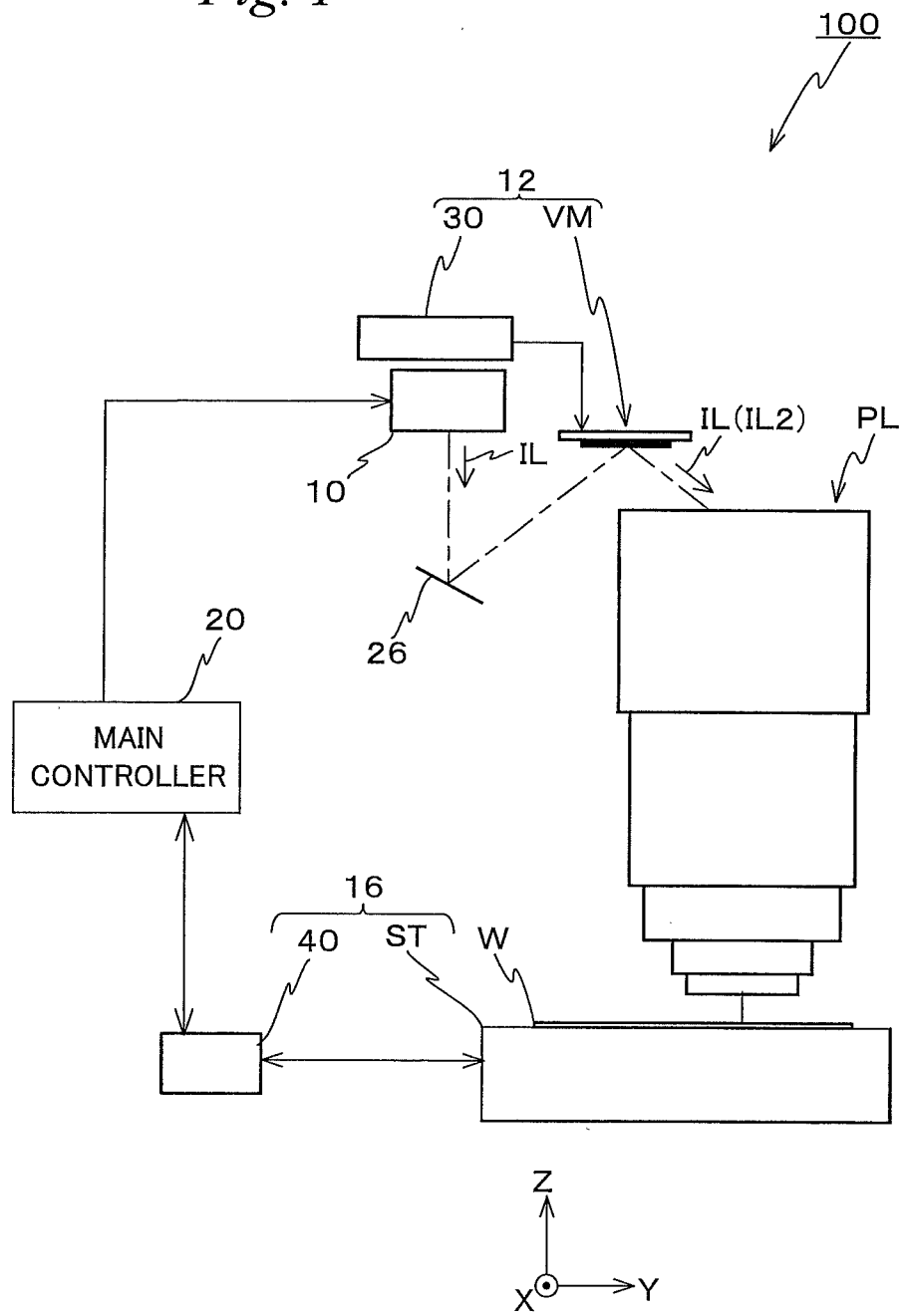
FIG. 1 is a schematic view showing an exposure apparatus related to an embodiment.

An embodiment of the present invention will be described below, referring to FIGS. 1 to 7B. FIG. 1 schematically shows a configuration of an exposure apparatus 100 related to the embodiment.

Exposure apparatus 100 includes an illumination system 10, a pattern generating device 12, a projection optical system PL, a stage device 16, a reflection mirror 26, a control system, and the like. Exposure apparatus 100 forms an image of a pattern (a pattern image) generated by pattern generating device 12 onto a wafer W mounted on a stage ST that constitutes a part of stage device 16, using projection optical system PL. The control system includes a microcomputer and is mainly configured of a main controller 20 that performs overall control of the entire apparatus.

Illumination system 10 includes a light source system including a light source unit and a light source control system; and an illumination optical system including a collimator lens, an optical integrator (such as a fly-eye lens, a rod-type integrator, or a diffraction element), a condenser lens, a field stop, a relay lens and the like; and the like (none of which are shown). From illumination system 10, an illumination light IL is emitted.

As the light source unit, as is disclosed in, for example, the pamphlet of International Publication No. 1999/46835 (the corresponding U.S. Pat. No. 7,023,610), a harmonic generating device is used that includes a solid laser light source such as a DFB semiconductor laser or a fiber laser, a light amplifying section having a fiber amplifier or the like, a wavelength converting section, and the like, and that outputs a pulsed light having a wavelength of 193 nm. Alternatively, the light source unit may be, for example, a laser diode that generates a continuous light or pulsed light having a wavelength of 440 nm.

Reflection mirror 26 reflects illumination light IL emitted from illumination system 10 toward a variable shaped mask VM (to be described later) of pattern generating device 12. Incidentally, in actuality, this reflection mirror 26 configures a part of the illumination optical system inside illuminations system 10, but is shown being taken outside illuminations system 10 in the drawing for the sake of convenience for explanation.

Pattern generating device 12 includes variable shaped mask VM, a mirror drive system 30, and the like.

Figure 2:
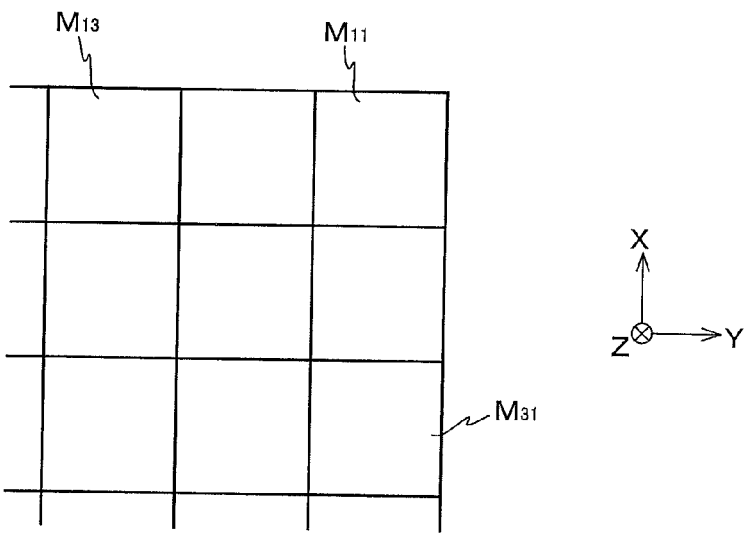
FIG. 2 is a plan view showing a variable shaped mask.

Variable shaped mask VM is placed on the +Z side of projection optical system PL on an optical path of illumination light IL reflected off reflection mirror 26. As variable shaped mask VM, as shown in FIG. 2 as an example, a micromirror array (which is also called a digital micromirror device (DMD)) serving as an optical device is used, which includes a plurality of micromirror mechanisms $M_{ij}$ (i=1 to m, j=1 to n) in m rows and n columns that are two-dimensionally placed (are placed in an array shape) within an XY plane. This micromirror array is made up of movable micromirror mechanisms formed with a MEMS technology on an integration circuit made in a CMOS process, and each micromirror mechanism $M_{ij}$ can drive its mirror surface (a reflection surface) in the Z-axis direction, or incline the mirror surface with respect to XY plane.

Micromirror mechanism $M_{ij}$ constituting variable shaped mask VM will be explained in detail below, using FIG. 3.

Figure 3:
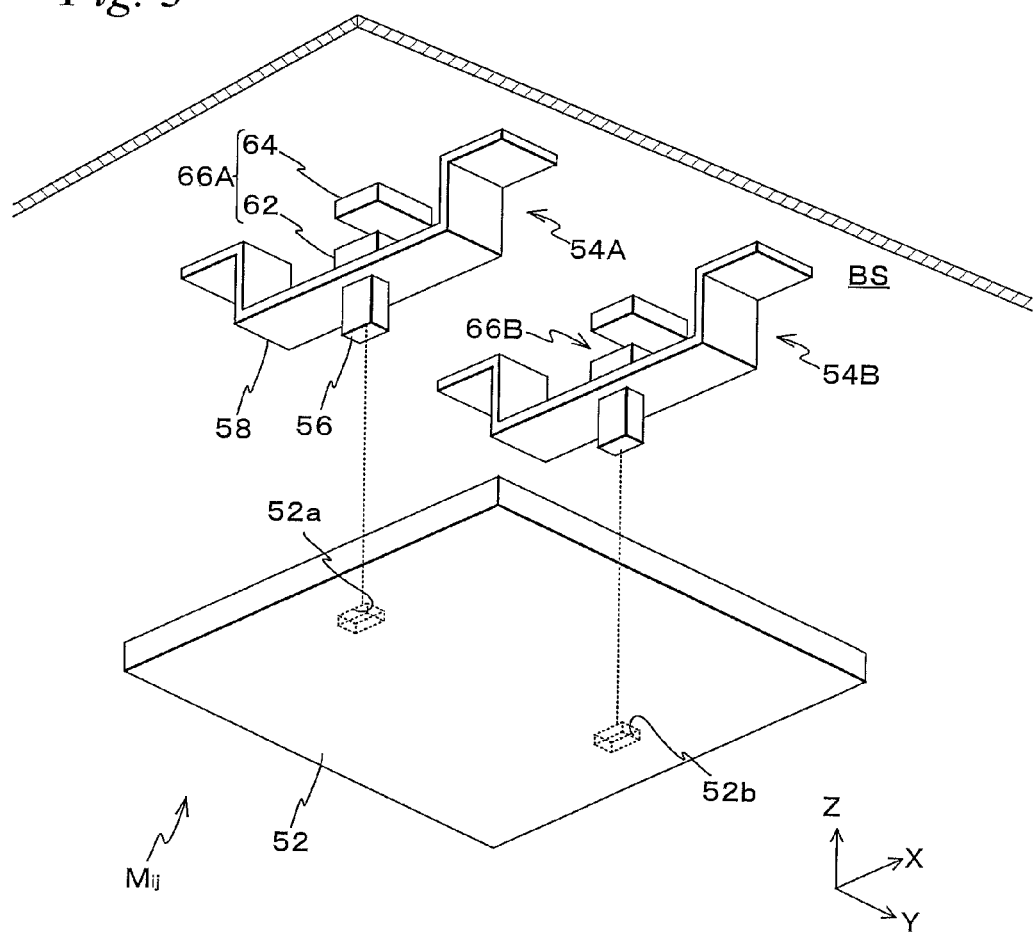
FIG. 3 is an exploded perspective view of a micromirror mechanism that constitutes the variable shaped mask.

FIG. 3 is an exploded perspective view showing micromirror mechanism $M_{ij}$ viewed from below. As can be seen from FIG. 3, micromirror mechanism $M_{ij}$ includes a mirror element 52, a pair of support mechanisms 54A and 54B, and a pair of drive mechanisms 66A and 66B that are arranged corresponding to the pair of support mechanisms 54A and 54B.

Mirror element 52 includes a plate-shaped member having a roughly square shape in a planar view (viewed from below) made of a monocrystalline silicon, and on a surface of the plate-shaped member on one side (−Z side), a mirror surface is formed by plating processing using aluminum or the like. And, on a surface on the other side (+Z side) of the plate-shaped member, a pair of contact holes 52a and 52b are formed.

One of the pair of support members 54A and 54B, support member 54A includes a support member main body 58 that is made up of a member formed by layering monocrystalline silicon or silicon nitride and has a crank-shaped bending section in the vicinity of both end portions in the X-axis direction, and a pin section 56 that is arranged in a state of protruding below (to the −Z direction) in substantially a center portion in the X-axis direction of support member main body 58.

The bending sections at both end portions of support member main body 58 (the uppermost surface of support member main body 58) are fixed to a base BS (in this case, the integration circuit made in the CMOS process described previously). Further, the center portion in the X-axis direction between the bending sections at both end portions has a function as a flexural spring having a predetermined elastic force in the Z-axis direction. Incidentally, in the description below, the section that does not contact with base BS in the center portion in the X-axis direction is to be referred to as "a spring section".

Of the pair of drive mechanism 66A and 66B, drive mechanisms 66A on the side corresponding to support member 54A includes a movable electrode 62 fixed to the upper surface (the surface on the +Z side) of the spring section of support member main body 58, and a fixed electrode 64 fixed to a position on base BS that faces movable electrode 62. By applying a voltage between movable electrode 62 and fixed electrode 64, an electrostatic force is generated between both electrodes 62 and 64.

Figure 4A:
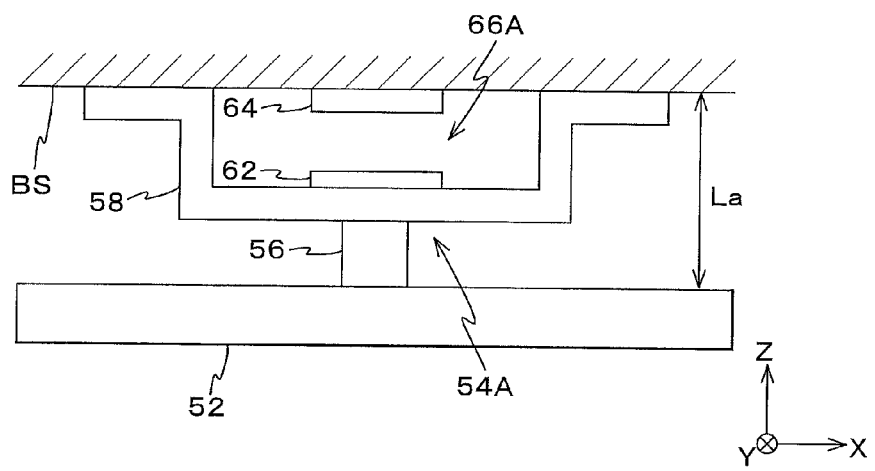
FIGS. 4A and 4B are views used to explain operations of a drive mechanism.

To explain more specifically, in the case when a voltage is not applied between fixed electrode 64 and movable electrode 62, as shown in FIG. 4A, an electrostatic force between electrodes 62 and 64 is zero and a force does not act on the spring section of support member main body 58, and therefore the spring section does not bend and is maintained in a predetermined initial state. Incidentally, it is assumed that the initial state indicates the case when a distance between the lowest end of support member 54A (the −Z side end portion of pin section 56) and base BS is "La".

Figure 4B:
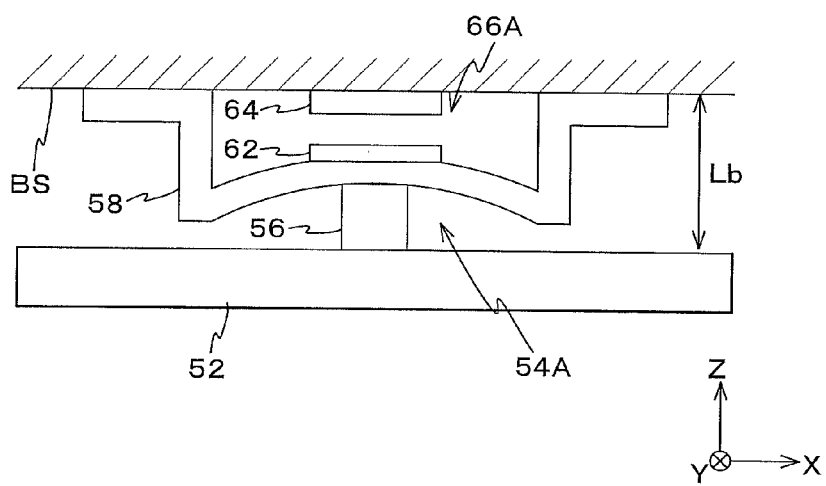

Meanwhile, when a voltage is applied between electrodes 62 and 64, as shown in FIG. 4B, an electrostatic force (a suction force) is generated between the electrodes, and the spring section of support member main body 58 bends upward (in the +Z direction). It is assumed that a distance between the lowermost end of support member 54A (the −Z side end portion of pin section 56) and base BS in this case is "Lb" (<"La"). Incidentally, when the distance between the lowermost end of support member 54A and base BS becomes Lb, electrodes 62 and 64 can come into contact, and in such a case, the surfaces of electrodes 62 and 64 are preferably coated with thick insulation films.

In this manner, in the embodiment, fixed electrode 64 and movable electrode 62 generate a drive force (an electrostatic force) in accordance with a drive signal (in the embodiment, the voltage between both electrodes) from main controller 20, and transform by flexure the spring section of support member main body 58, thereby driving mirror element 52.

In this case, the wiring and the like (not shown) with respect to support member 54A and drive mechanism 66A, and the electrodes constituting drive mechanism 66A can be manufactured by repeating operations to base BS such as generation of a silicon film, generation of an aluminum film, patterning by a photolithoetching method, formation of a sacrifice layer such as photoresist and the like, and by performing operations such as removal of the sacrifice layer.

Referring back to FIG. 3, the other support member, support member 54B and drive mechanism 66B corresponding to support member 54B also have the same configurations as support member 54A and drive mechanism 66A described above. Incidentally, drive mechanism 66A and drive mechanism 66B are not limited to mechanisms using electrostatic forces (electrostatic actuators), but for example, a drive mechanism using electromagnetic forces (Lorentz forces), a drive mechanism using piezo elements, or the like can also be employed.

Next, operations by drive mechanisms 66A and 66B will be explained based on FIGS. 5A to 5C.

Figure 5A:
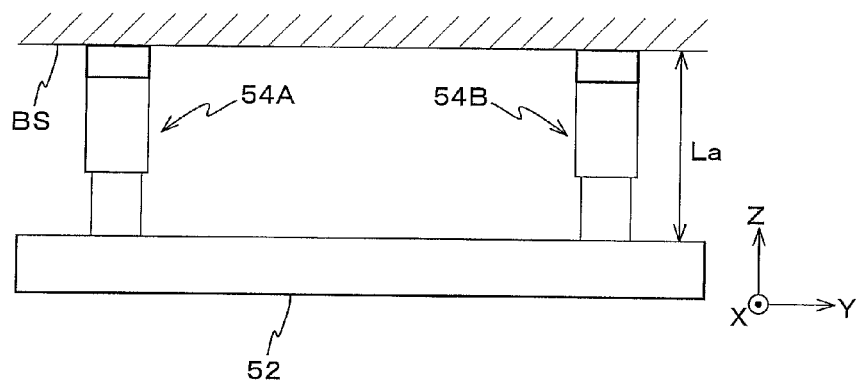
FIGS. 5A to 5C are views used to explain operations of the micromirror mechanism.

FIG. 5A shows a state where a voltage is not applied to drive mechanisms 66A and 66B. In this case, both support members 54A and 54B are maintained in the state of FIG. 4A described previously. Accordingly, mirror element 52 is held at a position that is distance La away from base BS and in parallel to base BS. On the other hand, FIG. 5B shows a state where a voltage is applied to both of drive mechanisms 66A and 66B. In this case, both support members 54A and 54B are maintained in the state of FIG. 4B described previously. Accordingly, mirror element 52 is held at a position that is distance Lb away from base BS and in parallel to base BS. More specifically, by applying a voltage to both drive mechanisms 66A and 66B, mirror element 52 has been translated by a distance (La−Lb) in the Z-axis direction from the state of FIG. 5A.

Figure 5B:
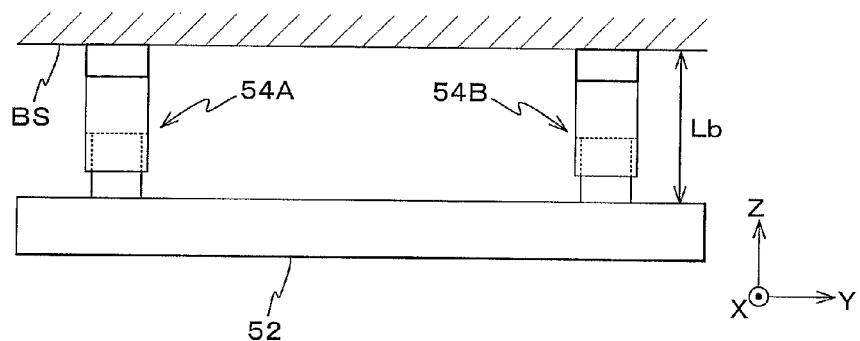
Figure 5C:
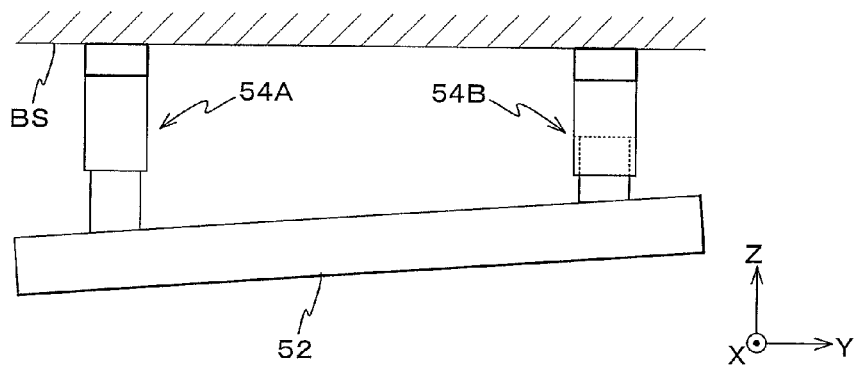

Furthermore, FIG. 5C shows a state where a voltage is applied to only one of the drive mechanisms, drive mechanism 66B. In this case, one of the support members, support member 54A is in the state of FIG. 4A described previously, and the other of the support members, support member 54B is in the state of FIG. 4B described previously. Accordingly, mirror element 52 is held in a state of inclining with respect to the XY plane.

In this case, when illumination light IL is irradiated in the state of FIG. 1 to mirror element 52 that is in the state (or attitude) shown in FIG. 5A, illumination light IL is reflected off the reflection surface of mirror element 52 and then is incident on projection optical system PL. Therefore, the state of mirror element 52 in FIG. 5A is to be also referred to as "a first ON state" hereinafter.

Further, when illumination light IL is irradiated in the state of FIG. 1 to mirror element 52 that is in the state (or attitude) shown in FIG. 5B, illumination light IL is reflected off the reflection surface of mirror element 52 and then is incident on projection optical system PL. Therefore, the state of mirror element 52 in FIG. 5B is to be also referred to as "a second ON state" hereinafter. Incidentally, the movement distance (La−Lb) in this case is decided so that a phase of illumination light IL (hereinafter, also referred to as a reflected light IL2) via mirror element 52 in the first ON state and a phase of reflected light IL2 via mirror element 52 in the second ON state shift from each other by a half wavelength.

Furthermore, when illumination light IL is irradiated to mirror element 52 in the state (or attitude) shown in FIG. 5C, illumination light IL is reflected off the reflection surface of mirror element 52, but the reflected light is not incident on projection optical system PL. Accordingly, the state of FIG. 5C is to be also referred to as "an OFF state" hereinafter.

In the embodiment, under instructions of main controller 20, mirror drive system 30 switches a state of each mirror element 52 independently between three states, which are the first ON state, the second ON state, and the OFF state.

Referring back to FIG. 1, mirror drive system 30 acquires design date of a pattern (e.g., CAD date) from among data necessary for forming a pattern image, from a higher-level device (not shown) via an interface (not shown). Then, based on the design data that has been acquired, mirror drive system 30 generates signals for driving mirror element 52 of each micromirror mechanism $M_{ij}$ and supplies them to electrodes 62 and 64 constituting drive mechanisms 66A and 66B, so that a light from variable shaped mask VM is irradiated to a divided area section subject to exposure on wafer W via projection optical system PL and a light from variable shaped mask VM is not irradiated to sections other than the divided area section subject to exposure on wafer W. In this case, either of a drive signal for making mirror element 52 be in "the first ON state", a drive signal for making mirror element 52 be in "the second ON state", or a drive signal for making mirror element 52 be in "the OFF state" is severally output to the electrodes of drive mechanisms 66A and 66B of each micromirror mechanism. With this operation, a pattern in accordance with the design data is generated by pattern generating device 12. Incidentally, the pattern generated by pattern generating device 12 changes according to movement of wafer W in a scanning direction (in this case, the Y-axis direction).

Projection optical system PL has a plurality of optical elements placed in a predetermined positional relation inside the barrel. Projection optical system PL reduces and projects the pattern generated by pattern generating device 12 onto wafer W placed on the surface to be exposed, with projection magnification β (β is, for example, ¼, ⅛, ⅟100, ⅟200, or ⅟400 times, or the like).

Stage device 16 is equipped with stage ST that is movable holding wafer W (an object) and a stage drive system 40 that controls an operating state (such as movement) of stage ST according to commands from main controller 20.

Stage ST is movable in the X-axis, Y-axis, and Z-axis directions and also rotatable in rotational (θx, θy, θz) directions around the X-axis, Y-axis and Z-axis, and can align wafer W in the directions of six degrees of freedom with respect to the pattern image of variable shaped mask VM that is generated via projection optical system PL. Moreover, in order to perform scanning exposure of wafer W with illumination light IL via variable shaped mask VM and projection optical system PL, stage ST is moved in a predetermined scanning direction (e.g., the Y-axis direction which is a horizontal direction in the page surface of FIG. 1) at a desired speed to synchronize a change in the pattern (a displayed image) generated at variable shaped mask VM and the movement of wafer W.

Positional information (including rotational information) of stage ST is measured by a position measurement system (not shown, e.g., including a laser interferometer and/or an encoder, and also including a focus sensor or the like, if needed), and is supplied to main controller 20. Based on this positional information, main controller 20 performs movement and position setting of wafer W by driving a motor or the like of stage drive system 40.

Main controller 20 controls operations of illumination system 10, pattern generating device 12, stage device 16, and the like, and forms images of patterns, which have been sequentially generated at variable shaped mask VM, on wafer W via projection optical system PL. On this operation, main controller 20 performs scanning type exposure by moving wafer W at an appropriate speed, and in synchronization with the movement of wafer W, scrolling the patterns generated by variable shaped mask VM using drive system 30.

In this case, in the embodiment, mirror element 52 has two kinds of the ON states, which are the first ON state and the second ON state, and the phase of reflected light IL2 that has been reflected off mirror element 52 in the first ON state and that in the second ON state shift from each other by a half wavelength, and therefore, by placing the mirror element in the first ON state and the mirror element in the second ON state in proximity, the function as a phase shift mask can be fulfilled.

As is described above, according to micromirror mechanism $M_{ij}$ related to the embodiment, a pair of support members 54A and 54B each having the spring section in a part thereof support mirror element 52, and a pair of drive mechanisms 66A and 66B arranged corresponding respectively to the pair of support members 54A and 54B transform the spring sections of the corresponding support members 54A and 54B, and thus a distance between a support point where support member 54A or 54B supports mirror element 52 and base BS severally changes. Accordingly, it becomes possible to translate mirror element 52 by driving all of drive mechanisms 66A and 66B, or incline mirror element 52 with respect base BS by driving some of the drive mechanisms.

Further, in variable shaped mask VM related to the embodiment that is configured using a plurality of micromirror mechanisms $M_{ij}$ described above, the spring sections of support members 54A and 54B that constitute each micromirror mechanism $M_{ij}$ are flexural type springs, and therefore, the spring constant can be larger compared with the case of using a torsion spring or the like, and also, when the electrostatic forces of drive mechanisms 66A and 66B are deactivated, the state of the spring sections can be returned from the state of FIG. 4B to the state of FIG. 4A with high responsivity and further the time required until the vibration attenuates can also be shortened. Accordingly, in the embodiment, switching between the ON state (the first ON state or the second ON state) where illumination light IL incident on and reflected off mirror element 52 of each micromirror mechanism $M_{ij}$ is incident on projection optical system PL and the OFF state where the reflected illumination light is not incident on projection optical system PL can be performed at a high speed. Further, since the spring sections of support members 54A and 54B are of flexural type, the response speed can be higher (the higher responsivity can be realized) by applying a tensional force.

Furthermore, in variable shaped mask VM of the embodiment, mirror element 52 of each micromirror mechanism $M_{ij}$ can be translated as is described above, and therefore by devising the placement of mirror elements 52 in the first ON state and the second ON state, variable shaped mask VM can be used as a phase shift mask. Consequently, fine patterns can be exposed with high precision.

Further, in the embodiment, the state where the mirror elements are inclined with respect to the base is not regarded as the ON state, unlike the conventional method, and therefore the phase difference does not occur between reflected lights reflected off adjacent mirror elements, and high-precision exposure can be performed also from this aspect.

Incidentally, in the embodiment above, the configuration has been explained in which one micromirror mechanisms $M_{ij}$ is equipped with a pair of support members 54A and 54B and a pair of drive mechanisms 66A and 66B arranged corresponding to the pair of support members 54A and 54B, but the configuration is not limited to such configuration, and one micromirror mechanism $M_{ij}$ may be equipped with three or more support members and three or more drive mechanisms corresponding thereto.

Figure 6A:
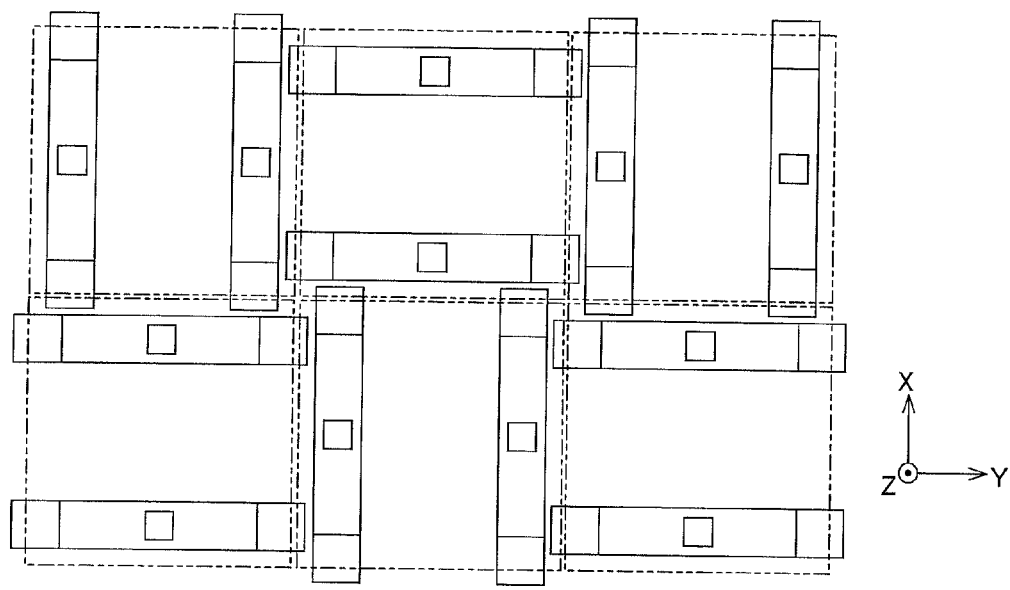
FIGS. 6A and 6B are views (No. 1) showing a modified example of the embodiment.
Figure 6B:
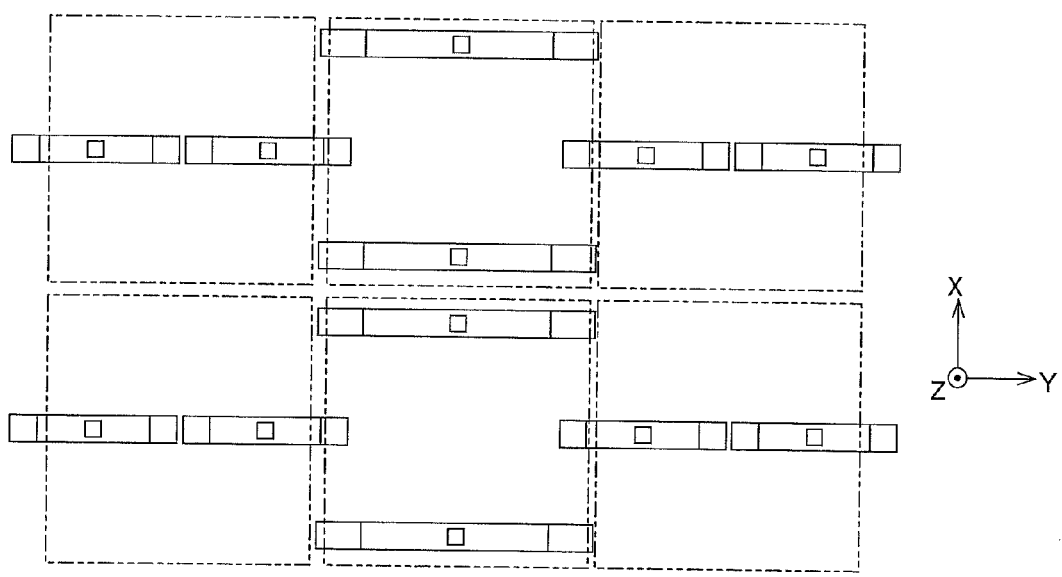

Incidentally, in the embodiment above, the case has been explained where a pair of the support members has the longitudinal direction in the X-axis direction, but the longitudinal direction is not limited to the X-axis direction, and for example, a pair of the support members may have their longitudinal direction in the Y-axis direction, or a micromirror mechanism having support members whose longitudinal direction is in the Y-axis direction and a micromirror mechanism having support members whose longitudinal direction is in the X-axis direction may be used together. In the case when micromirror mechanisms having different types of support members are used together in this manner, for example, as shown in FIG. 6A, adjacent micromirror mechanisms can be micromirror mechanisms having different types of support members. With this arrangement, for example, as shown in FIG. 6A, even in the case when the overall length of the support member is longer than the length of a side of a mirror element, the mirror elements can be placed in the array shape without the support members mechanically interfering with each other. Alternatively, as shown in FIG. 6B, a micromirror mechanism in which support members having the longitudinal direction in the Y-axis direction are placed a predetermined distance away in the X-axis direction and a micromirror mechanism in which support members having the longitudinal direction in the Y-axis direction are placed a predetermined distance away in the Y-axis direction may be alternately placed in the Y-axis direction. With these placements, the support members of the adjacent micromirror mechanisms do not mechanically interfere with each other, and therefore the mirror elements can be placed in the array shape. As a matter of course, the support members may have the longitudinal direction in a direction intersecting the X-axis and the Y-axis.

Figure 7:
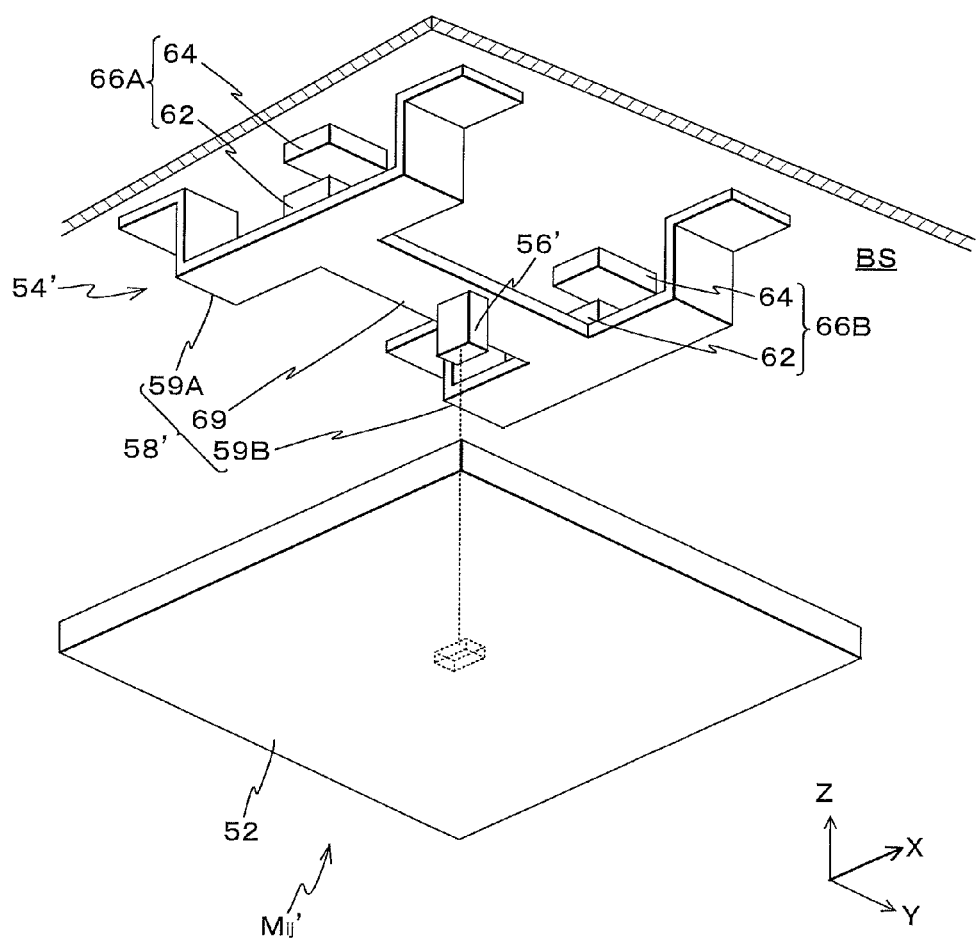
FIG. 7 is a view (No. 2) showing a modified example of the embodiment.

Incidentally, in the embodiment above, the case has been explained where a plurality of the support members and a plurality of the drive mechanisms corresponding thereto are equipped, but the configuration is not limited thereto, and a configuration as shown in FIG. 7 can also be employed.

A micromirror mechanism $M_{ij}'$ shown in FIG. 7 includes mirror element 52, a support member 54' that supports mirror element 52, and a pair of drive mechanisms 66A and 66B arranged between support member 54' and base BS.

As shown in FIG. 7, support member 54' includes a support member main body 58' having a roughly H shape in a planar view, and a pin section 56' (e.g., a "connecting section") arranged in a center portion on the lower surface of support member main body 58' within the XY plane.

Support member main body 58' is manufactured using a member similar to that of support member main body 58 explained in the embodiment above, in the similar manufacturing method, and has a pair of driven sections (e.g. "elastic sections") 59A and 59B that extend in the X-axis direction and are placed a predetermined distance away in the Y-axis direction and a coupling section 69 that couples center portions in the X-axis direction of the respective driven sections 59A and 59B. Both end portions in the X-axis direction of driven sections 59A and 59B are bent sequentially to the −Z direction and the +X direction (or −X direction), and the bent portions (the portions having the XY plane) are fixed to base BS. Further, the center portions of driven sections 59A and 59B (the portions that is noncontact with base BS) serve as the spring sections, similar to the embodiment above.

A pair of drive mechanisms 66A and 66B each include movable electrode 62 arranged on the +Z side surface of driven section 59A or 59B and fixed electrode 64 arranged at a position, which faces movable electrode 62, on base BS. Incidentally, because the pair of drive mechanisms 66A and 66B used in this case are the same as those in the embodiment above, their explanation will be omitted herein.

In micromirror mechanism $M_{ij}'$ in FIG. 7 having the foregoing configuration, the drive similar to the embodiment above can be performed. More specifically, any one of the state (the first ON state) where a voltage is applied to none of drive mechanisms 66A and 66B, the state (the second ON state) where a voltage is applied to both of drive mechanisms 66A and 66B, and the state (the OFF state) where mirror element 52 is inclined with respect to the XY plane by applying a voltage to one of the drive mechanisms can be selectively switched.

By employing such configuration, mirror element 52 can be driven in the similar manner to the embodiment above, and also mirror element 52 can be supported at one point, and therefore, the possibility that a force to transform mirror element 52 is given is lower, compared with the case when the mirror element is supported at a plurality of points.

Figure 8:
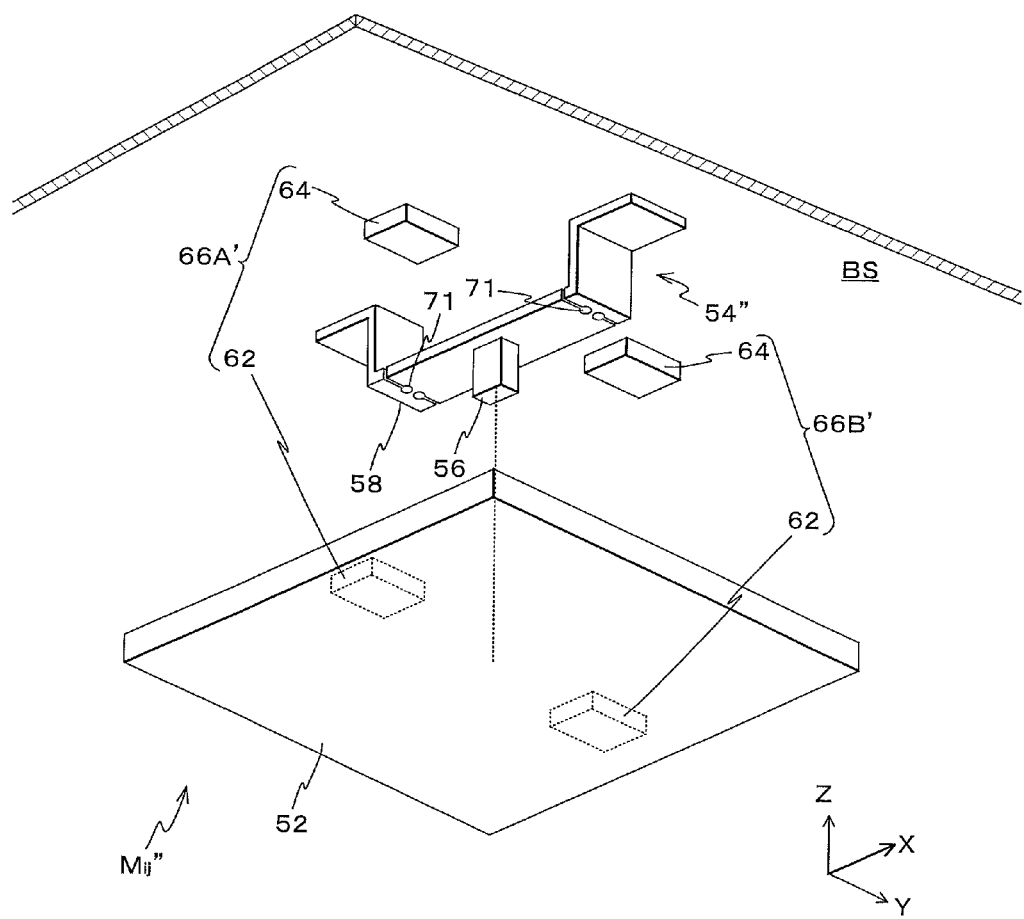
FIG. 8 is a view (No. 3) showing a modified example of the embodiment.
Figure 9:
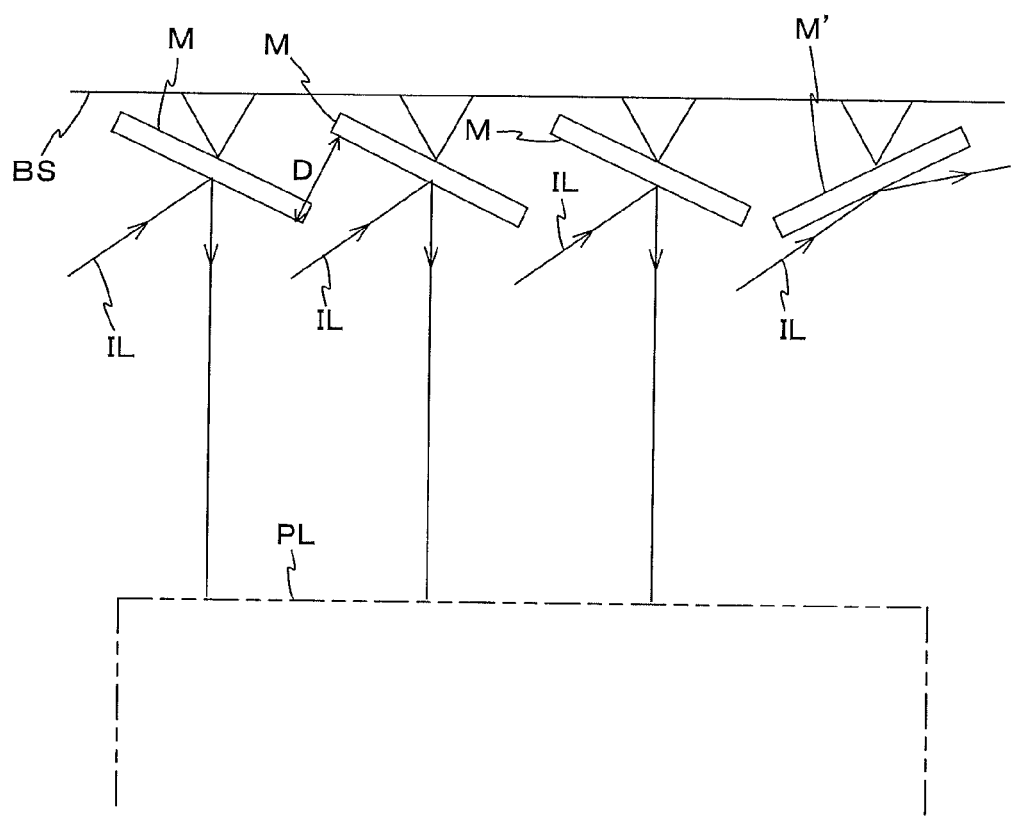
FIG. 9 is a view showing a conventional variable shaped mask.

Moreover, a micromirror mechanism as shown in FIG. 8 can also be used. A micromirror mechanisms $M_{ij}''$ shown in FIG. 8 includes mirror element 52, a support member 54'' that supports mirror element 52, a drive mechanism 66A' placed a predetermined distance away on the −Y side of support member 54'', and a drive mechanism 66B' placed a predetermined distance away on the +Y side of support member 54''.

Although support member 54'' has substantially a similar configuration to that of support member 54A or 54B in the embodiment above, support member 54'' has a pair of hinge sections 71 formed in a part of support member main body 58 that constitutes support member 54'', which is different from support member 54A or 54B.

Although drive mechanism 66A' or 66B' has substantially a similar configuration to that of drive mechanism 66A or 66B in the embodiment above (the configuration including fixed electrode 64 and movable electrode 62), movable electrode 62 is directly fixed to mirror element 52 in drive mechanism 66A' or 66B', which is different from drive mechanism 66A or 66B.

In micromirror mechanism $M_{ij}''$ having a such configuration, in a state where a voltage is not applied to any of a pair of drive mechanisms 66A' and 66B', mirror element 52 can be supported parallel to base BS at a position having a predetermined height, and in a state where a voltage is applied to both of a pair of drive mechanisms 66A' and 66B', mirror element 52 can be supported parallel to base BS at a position higher than the predetermined height, and furthermore, in a state where a voltage is applied to one of a pair of drive mechanisms 66A' and 66B' and a voltage is not applied to the other, mirror element 52 can be rotated (inclined) around the X-axis. In this case, a pair of hinge sections 71 formed at support member main body 58 allows the inclination to be performed without difficulty.

Incidentally, in the embodiment above, the mirror element is employed as an optical element, but the optical element is not limited to the mirror element and other optical elements such as a lens element can also be used. Further, in the embodiment above, a pair of variable shaped mask (micromirror arrays) VM and projection optical system PL were to be arranged, but multiple pairs of variable masks VM and projection optical systems PL may also be arranged, or the number of variable shaped masks VM and the number of projection optical systems PL may be different. In the former case, for example, the positions of projection areas of a plurality of projection optical systems PL (corresponding to the irradiation areas of illumination light IL) may be different in a direction (e.g., the X-axis direction) intersecting the scanning direction (the Y-axis direction), more specifically, for example, a plurality of the projection areas may be placed in one row along the X-axis direction, or a plurality of the projection areas may be placed along a plurality of rows that are away in the Y-axis direction in a nesting arrangement, that is, in a zigzag arrangement. And, in the latter case, for example, with respect to the N number (an integer not less than 1) of variable shaped masks VM, the M (≥N+1) number of projection optical systems PL are arranged, or with respect to the M number of variable shaped masks VM, the n number of projection optical systems PL may be arranged.

Incidentally, in the embodiment above, the case has been explained where the optical device of the present invention is applied to variable shaped mask VM, but the application of the optical device is not limited thereto, and the optical device of the present invention may be arranged within an illumination system (an illumination optical system) and generation of uneven illumination may be restrained by using the optical device.

Further, the present invention is not limited to the application to the exposure apparatus for manufacturing semiconductor devices, but for example, can be widely applied also to an exposure apparatus for manufacturing display devices such as a liquid crystal display device formed on a rectangular glass plate or a plasma display, or exposure apparatuses for manufacturing various types of devices such as imaging devices (such as CCDs), micromachines, thin film magnetic heads, and DNA'chips. Furthermore, the present invention can also be applied to an exposure apparatus that manufactures a mask (such as a photomask, or a reticle) on which mask patterns of various types of devices are formed, using a lithography process. As is described above, an object that is subject to exposure to which an energy beam is irradiated in the embodiment above is not limited to a wafer, but may be other objects such as a glass plate, a ceramic substrate, or a mask blank.

Semiconductor devices are manufactured through the following steps: a step where the function/performance design of a device is performed, a step where a wafer is formed using silicon materials, a step where the wafer is exposed via a variable shaped mask by the exposure apparatus of the embodiment above; a step where a circuit pattern is formed such as etching; a device assembly step (including a dicing process, a bonding process, and a packaging process); an inspection step; and the like.

Incidentally, in the embodiment above, the case has been explained where the optical device of the present invention is used in the exposure apparatus, but the use of the present invention is not limited thereto, and for example, the optical device of the present invention can also be used for a projection image display device such as a projector, or, for example, can also be used for various purposes such as an optical information processor, an electrostatic photographic printing device, an optical switch used in optical communication, a switched blazed grating device, or a plate setter used in the printing field. In this case, the present invention is not limited to the case of including a plurality of micromirrors (optical elements) but can also be applied to the case of including only one micromirror mechanism.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A microactuator that drives a driven body, the microactuator comprising:
    a support member having
        a pair of elastic sections,
        a coupling section that couples the elastic sections, and
        a connecting section that connects the coupling section and the driven body together; and
    a pair of drive mechanisms that are arranged respectively corresponding to the pair of the elastic sections, wherein each drive mechanism of the pair of the drive mechanisms transforms the corresponding elastic section to thereby change at least one of an attitude and an altitude of the driven body,
    wherein the connecting section is a single connecting section that connects the coupling section and the driven body together so that the driven body is supported at only one point.

2. An optical device, comprising:
    an optical element; and
    the microactuator according to claim 1 that drives the optical element serving as the driven body.

3. The optical device according to claim 2, wherein a plurality of the optical elements and a plurality of the microactuators are provided.

4. The optical device according to claim 3, wherein the plurality of the optical elements are placed in an array shape.

5. The optical device according to claim 2, wherein the optical element is a mirror element having a reflection surface.

6. The optical device according to claim 2, further comprising:
    a controller that drives and controls at least one of the drive mechanisms.

7. The optical device according to claim 6, wherein
    the optical element is a mirror element having a reflection surface, and
    the controller switches a state of the reflection surface between a first ON state where the reflection surface is positioned on a first plane that is parallel to a predetermined reference plane and is a first predetermined distance away from the reference plane, a second ON state where the reflection surface is positioned on a second plane that is parallel to the reference plane and is a second predetermined distance away from the reference plane, and an OFF state where the reflection surface is inclined with respect to the reference plane, the second predetermined distance being different from the first predetermined distance.

8. An exposure apparatus that exposes an object, the apparatus comprising:

the optical device according to claim 7 that generates a predetermined pattern by being irradiated with an illumination light, wherein the optical element is included in an array of optical elements, and a phase of the illumination light via the optical element in the first ON state and a phase of the illumination light via a different optical element included in the array in the second ON state shift from each other by a half wavelength.

9. The exposure apparatus according to claim 8, further comprising:

a movable body that moves holding the object, wherein the controller controls each of the drive mechanisms in synchronization with movement of the movable body in a predetermined direction.

10. A device manufacturing method including a lithography process, wherein the lithography process comprises performing exposure using the exposure apparatus according to claim 8.

11. An exposure apparatus that exposes an object using an illumination light, the apparatus comprising:

the optical device according to claim 6 that is placed on an optical path of the illumination light, wherein the object is exposed using the illumination light via the optical device.

12. The exposure apparatus according to claim 11, wherein the optical device generates a predetermined pattern by being irradiated with the illumination light.

13. The exposure apparatus according to claim 11, further comprising:

a movable body that moves holding the object, wherein the controller controls each of the drive mechanisms in synchronization with movement of the movable body in a predetermined direction.

14. A device manufacturing method including a lithography process, wherein the lithography process includes performing exposure using the exposure apparatus according to claim 11.

15. The microactuator according to claim 1, wherein the driven body is a mirror element.

* * * * *